United States Patent [19]

Kinoshita et al.

[11] Patent Number: 4,788,458

[45] Date of Patent: Nov. 29, 1988

[54] TWO WIRE INTERFACE CIRCUIT

[75] Inventors: Roy Y. Kinoshita, Anaheim; Patrick E. McCollum, Yorba Linda, both of Calif.

[73] Assignee: Rockwell International Corporation, El Segundo, Calif.

[21] Appl. No.: 73,921

[22] Filed: Jul. 15, 1987

[51] Int. Cl.[4] ..................... H03K 19/092; H03K 5/08
[52] U.S. Cl. .................................. 307/475; 307/311; 307/491; 307/549
[58] Field of Search ............... 307/311, 475, 490, 491, 307/493, 549, 552

[56] References Cited

PUBLICATIONS

J. Glaab, "Optical Couplers Isolate, Control and Monitor to Allow 6-kV Supply to Float", Electronic Design 4, Feb. 15, 1977, pp. 134 & 136.
NAC publication, "Remote Power Controller for the Advanced Aircraft Electrical System", pub. by Naval Avionics Center, May 1982, cover & pp. 4-14.
Rockwell International Technical Proposal, T84-475/201, vol. II, 14 Jun. 1984, title "Airborne Solid State DC Power Controllers", cover, forward, and pp. 9, 10, and 11.

Primary Examiner—John Zazworsky
Attorney, Agent, or Firm—H. Fredrick Hamann; George A. Montanye; James F. Kirk

[57] ABSTRACT

An interface circuit having a first reference terminal and a first input terminal for receiving a first input current signal, referenced to said first reference terminal from a first input current signal source. The circuit also has a second reference terminal and a second input terminal for receiving a second input current signal referenced to said second reference terminal from a second input current signal source. The second input current signal has a first and second signal current level. The interface circuit comprises a first receiver means coupled between the first input terminal and a first receiver means reference terminal. The first receiver means is responsive to the first input current signal first and second signal current levels for providing a first output signal at respective first and second levels. The first output signal is referenced to the second reference potential at a first signal output terminal. A second receiver means is coupled between the first receiver reference terminal and the first reference terminal. The second receiver means is responsive to the second input current signal for decreasing and increasing the resistance between the first receiver reference terminal and the first reference terminal to predetermined values. The input resistance between the first receiver reference terminal and the first reference terminal being substantially independent of the first input current signal first and second signal current levels.

5 Claims, 6 Drawing Sheets

TWO WIRE INTERFACE CIRCUIT

The invention herein described was made in the course of or under a contract or subcontract thereunder, with the Department of the Navy (Contract N62269-85-C-0224).

FIELD OF THE INVENTION

1. Background

This invention relates to the field of interface circuits and more particularly to interface circuits used to couple digital information from one digital circuit to another, the circuits frequently being in different assemblies or on different modules within an assembly. The invention relates more particularly to the field of line drivers and receivers used in connection with aircraft electronic assemblies.

2. Prior Art

The invention two wire interface circuit characterizes a receiver for coupling digital information referenced to a first reference or ground potential to a second reference or second ground potential isolated from the first ground system. Optical couplers are employed to achieve the required coupling functions. The transfer function, i.e. the output to input current gain of an optical coupler is a very loosely controlled function. The wide tolerance associated with this type of component makes threshold prediction over wide temperature ranges difficult. Optical couplers typically also have widely varying forward voltage requirements for the light emitting diode over the temperature range. The temperature range of interest for military airborne applications is typically −55° C. to 105° C.

The U.S. Navy Multiplex Electrical Distribution and Control Interface Systems (MEDC) impose the requirement that a two wire interface circuit operate reliably over the temperature range of −55° C. to 105° C. for use in Navy airborne applications. The MEDC interface systems requirements characterize an interface circuit input signal having a low and a high logic level. The low logic level is characterized by an input current ranging from zero to 3 milliamperes. The high logic level is characterized as an input current to the interface circuit ranging from nine to 11 milliamperes. Input currents ranging from three to nine milliamperes can result in an indeterminate output. The MEDC interface also requires three distinct reflected resistances at the interface input that depend on the system status and which are not dependent on the state of the interface circuit input signal. One of the status conditions is the requirement for a predetermined interface resistance with no power applied to the circuit. The circuit is required to reflect predetermined first and second resistances to the two wire interface circuit input in response to signals received by the circuit referenced to the second and isolated ground system.

NAC Publication No. TR-2303, dated May 1982 and titled "Remote Power Controller for the Advanced Aircraft Electrical System", published at the Naval Avionics Center, Indianapolis, Ind., 46218, shows a schematic titled "Figure 4. RPC Schematic Drawing" that characterizes a remote power controller circuit that shows as part of its topology a two-wire interface circuit. The two-wire interface circuit of this reference shows light emitting diode A1 operating in combination with transistor A1 in response to a first input current signal via the control input line and being returned via the signal ground line. This reference fails to teach or suggest the use of a threshold detector for the purpose of establishing a predetermined threshold at which the two-wire interface circuit responds to the first input current signal such as IN1.

Rockwell Proposal No. T84-475/201 dated June 14, 1984 shows a two-wire interface circuit in FIG. 3 on Page 10. This reference also fails to teach or suggest the use of a threshold detector to establish a predetermined level at which the two-wire interface circuit operates in response to a first input current signal such as IN1.

SUMMARY OF THE INVENTION

A two wire interface circuit is described for receiving an interface circuit input signal characterized as a first input current signal IN1 referenced to a first reference terminal (i.e. GND1) from a first input current signal source. The circuit has at least a second input terminal for receiving a second input current signal referenced to a second reference terminal (GND2), i.e. a second ground (GND2) isolated from the first reference terminal (GND1). The second input current signal IN2 is sourced by a second input current signal source. The first and second current signals have respective first and second signal current levels for low and high logic signal levels. The interface circuit has at least a first and second receiver means. The first receiver means is coupled between the first input terminal and a first receiver means reference terminal. The second receiver means is coupled between the first receiver reference terminal and the first reference terminal, i.e. GND1.

The first receiver means is responsive to the first input current signal first and second signal current levels for providing a first output signal at first and second levels. The first output signal is referenced to the second reference potential, i.e. GND2 at a first signal output terminal.

The second receiver means is responsive to the second input current signal having a value greater than a first predetermined level for decreasing the resistance between the first receiver reference terminal and the first reference terminal to a value less than a first predetermined value. The second receiver means increases the resistance between the first receiver reference terminal and the first reference terminal to be greater than a second predetermined value in response to the second input current signal being less than a second predetermined level. The input resistance between the input terminal and the first reference terminal is substantially independent of the logic state of the first input current signal and the second signal current levels.

PREFERRED EMBODIMENT

Figure 1:
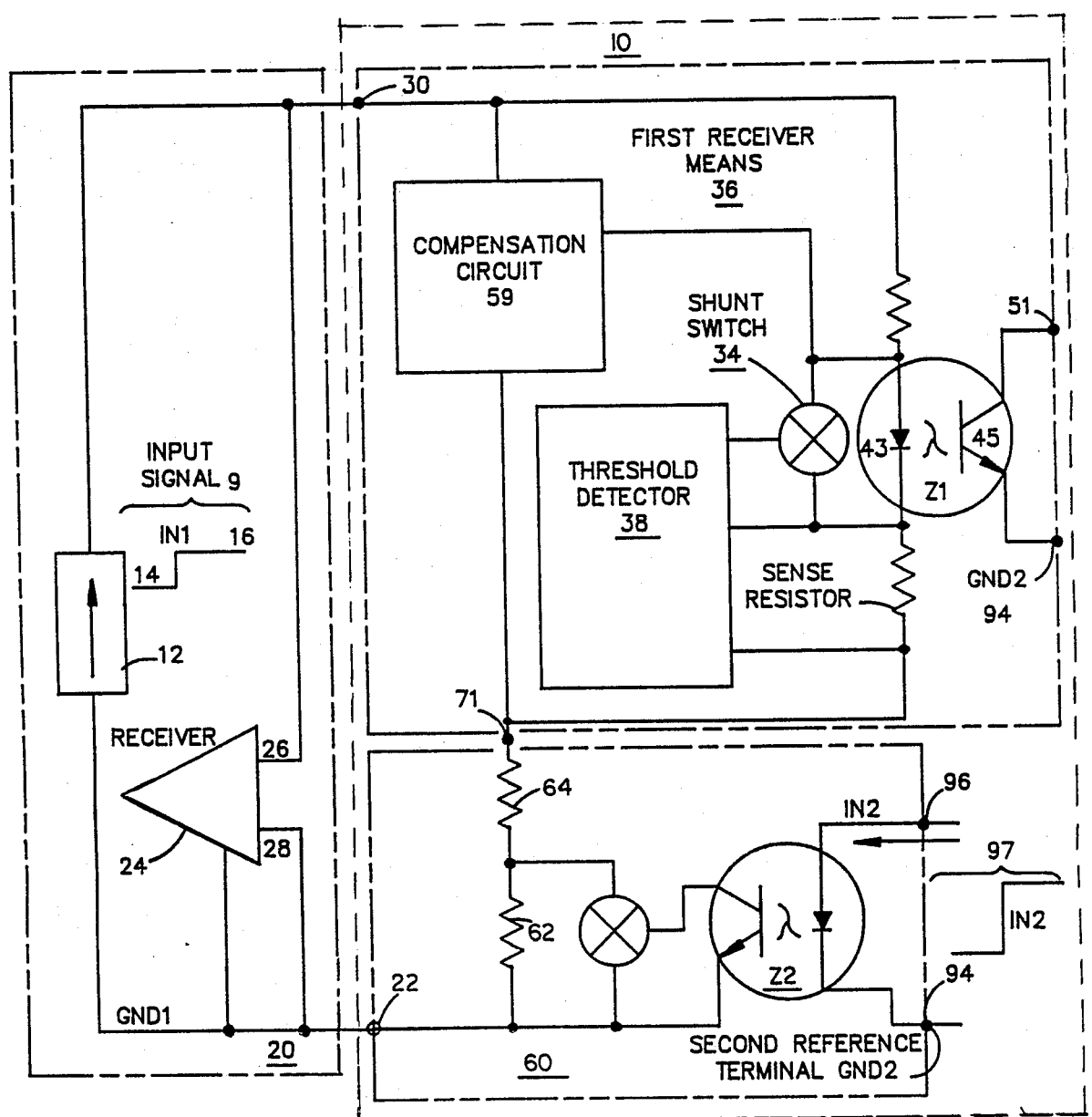
FIG. 1 is a block diagram of the invention two wire interface circuit.

FIG. 1 is a block diagram of the invention interface circuit 10. First input terminal 30 receives a first input current signal 9 having a first and second level value 14, 16. Each of these respective values have an acceptable respective input current range such as $0.0 \leq IN1 \leq 3.0$ mA and $9.0 \leq IN1 \leq 11.0$ mA. Each value represents a respective logic signal level such as a logic "0" or a logic "1". The first input current signal is referenced to a first reference terminal 22 from a first input current signal source 12. Second input terminal 96 receives a second input current signal 97 referenced to a second reference terminal 94 from a second input current signal source (not shown). The first and second input current signals each have first and second signal current levels to represent a respective logic low and logic high level conditions. Phantom block 36 encloses a FIRST RECEIVER MEANS having a first signal output terminal 51 referenced to second reference potential GND2, 94.

Figure 2:
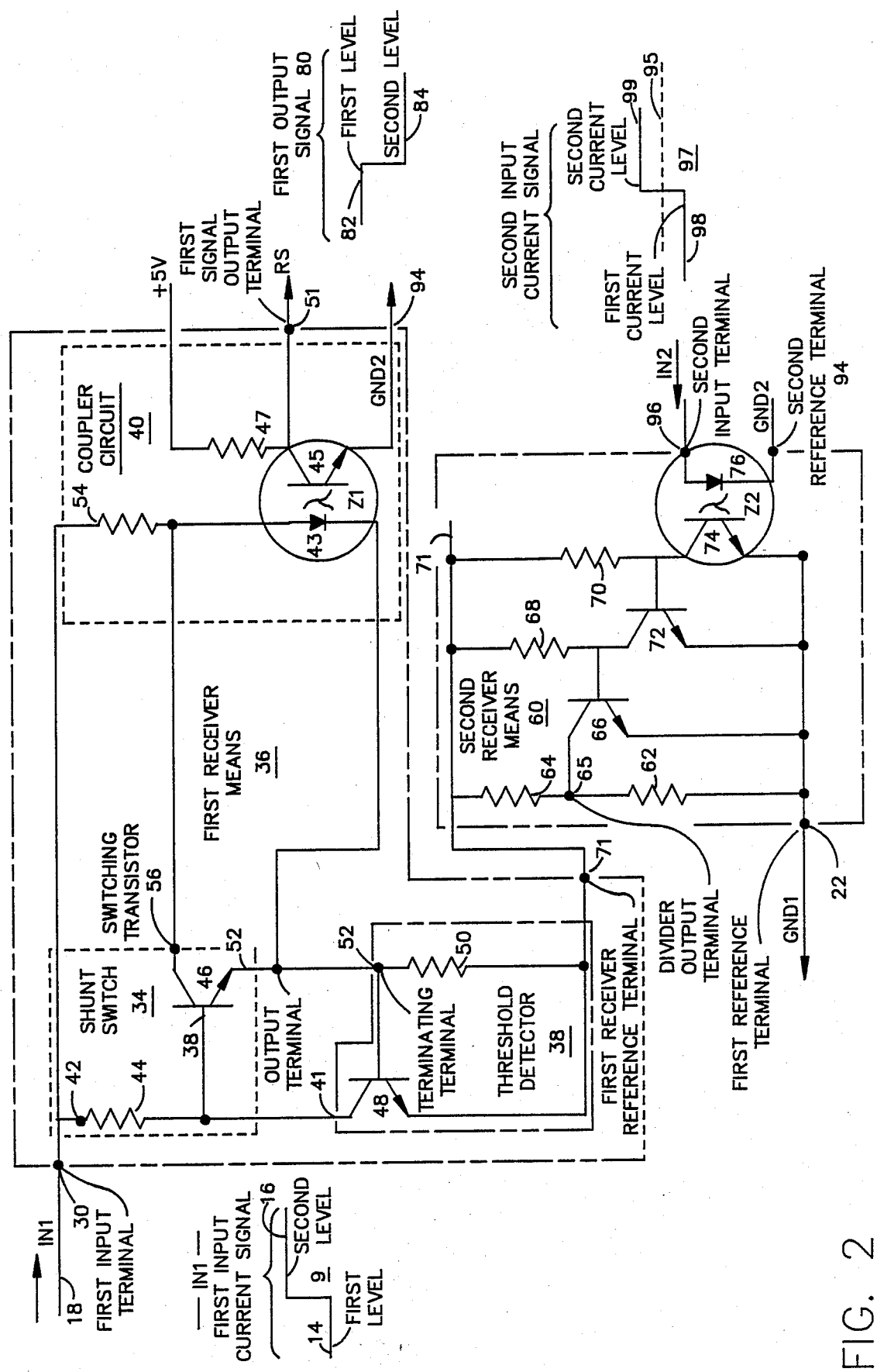
FIG. 2 is an abbreviated schematic showing an embodiment of the first receiver means without a compensation circuit and showing an embodiment of the second receiver means.

Referring to FIG. 2, the invention interface circuit is shown having a first receiver means such as, but not limited to, the circuitry contained in phantom block 36. The first receiver means is coupled between first input terminal 30 and first receiver means reference terminal 71. The first receiver means 36 has a threshold detector 38 that is responsive to a predetermined first input current signal threshold level 11, i.e. 6.0 mA, for providing a first output signal RS 80 at respective first and second levels 82, 84. The first output signal 80 is provided at a first signal output terminal 51 and is referenced to the second reference potential GND2 94.

The invention has a second receiver means such as circuit contained in phantom block 60. The circuit of phantom block 60 is responsive to the second input current signal having a value greater than a first predetermined level 95 measured with respect to the second reference terminal 94 for decreasing the resistance between the first receiver reference terminal 71 and the first reference terminal 22 to a value less than a first predetermined value. Waveform 97 represents the second input current signal which is also a two level input signal, each respective level characterizing a logic state. The first current level 98, typically zero, is shown rising past a threshold level 95 to the second current level 99, typically 1.5 milliamperes for the 4N49 coupler used in FIG. 4.

The second receiver, being a binary circuit, increases the resistance between the first receiver reference terminal 71 and the first reference terminal 22 to be greater than a second predetermined value in response to the second input current signal IN2 being less than a second predetermined level such as current threshold 95.

The input resistance between the first receiver reference terminal 71 and the first reference terminal 22 is substantially independent of the first input current signal 9 first and second current levels 14, 16. The resistance between the first receiver reference terminal 71 and the first reference terminal 22 is intended to only be a function of the second signal current level IN2.

FIG. 2 shows that the first receiver means 36 has a threshold detector circuit such as the circuit contained within phantom block 38. The threshold detector circuit 38 has a sense resistor 50 coupled between a terminating terminal 62 and the first receiver reference terminal 71. The threshold detector circuit 38 also has a switch such as the bipolar NPN transistor 48 for coupling a threshold detector circuit output terminal 41 to the first receiver reference terminal 71 in response to current through the sense resistor, i.e. from terminating terminal 52 to first receiver reference terminal 71, exceeding a predetermined limit such as a value required to produce a voltage across sense resistor 50 exceeding the base to emitter voltage of transistor 48.

The first receiver means 36 is shown having a coupler circuit, such as the circuit contained within phantom block 40. The coupler circuit 40 has a sensing diode, such as diode 43, having an anode and a cathode. A current limiting resistor, such as R54 is coupled from the first input terminal 30 to the current sense diode anode. The sense diode cathode is coupled to the threshold detector circuit terminating terminal 52. The coupler circuit has an output switching means having a conduction channel coupled between the first signal output terminal 51 and the second reference terminal 94. The coupler circuit is characterized to transfer the conduction channel of transistor 45 to a conductive state in response to current passing through the sensing diode from the sense diode anode to cathode and the current exceeding a predetermined level.

Phantom block 34 contains circuitry for the function of a shunt switch circuit having a switching transistor, such as bipolar NPN transistor 46 having a control terminal such as its base and a conduction channel such as that established between the collector terminal 56 and the emitter terminal, i.e. terminating terminal 52. The output switch collector terminal 56 is coupled to the coupler circuit sensing diode anode. The output switch emitter terminal 52 is coupled to the coupler circuit 40 sensing diode cathode. The switching transistor control terminal, i.e. its base 39, is coupled to the interface circuit first input terminal 30 via resistor 44. The transistor switch conduction channel is characterized to be conductive in response to a first input current signal second level, i.e. a signal level sourcing current from the interface circuit first input terminal 30, to the switching transistor control terminal 39. The transistor switch conduction channel is characterized to be substantially conductive in response to the first input current signal assuming a first level, i.e. a low logic level of less than three milliamperes.

Figure 3:
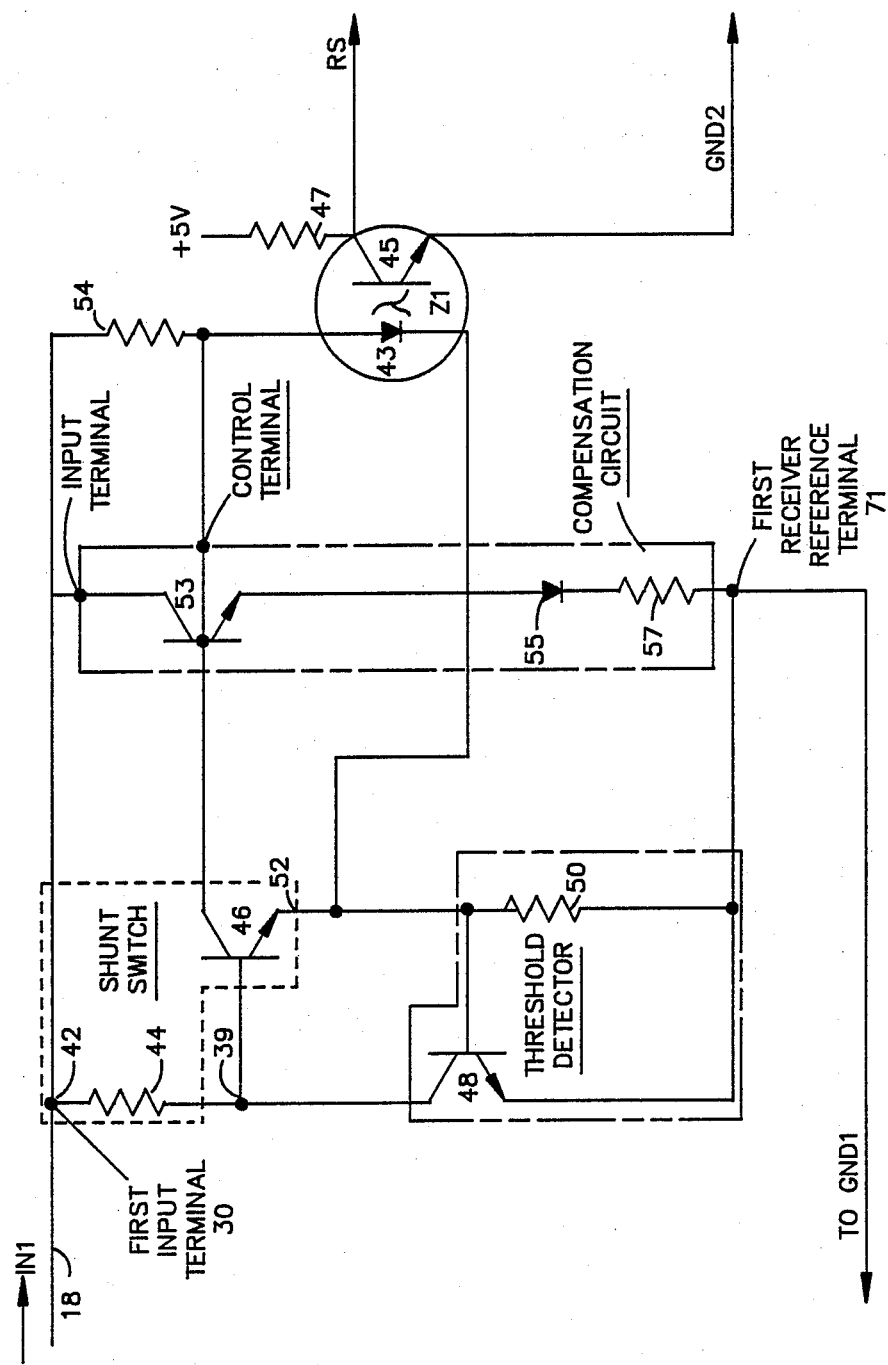
FIG. 3 is a schematic of the first receiver means showing a compensation network.

FIG. 3 is an expanded schematic of the first receiver means 36 of FIG. 2. FIG. 3 shows the first receiver means as having a compensation circuit such as the compensation circuit contained within phantom block 59. The compensation circuit of phantom block 59 has an input terminal coupled to the interface circuit first input terminal 30. The compensation circuit also has a control terminal coupled to the coupler circuit sense diode anode and to the shunt switch switching transistor collector 56. The compensation circuit has a reference terminal coupled to the receiver circuit reference terminal 71.

The compensation circuit 59 is characterized to provide a predetermined compensation current to the first receiver reference terminal 71 in response to the shunt switch switching transistor 46 being non-conductive. The compensation circuit 59 interrupts the predetermined compensation current to the first receiver reference terminal 71 in response to the shunt switch switching transistor 46 being conductive. As IN1 exceeds the required threshold level for a logic high level, threshold detector transistor 48 is conductive and shunt switch 46 is non-conductive because threshold detector 48 pulls the base 39 of the transistor 46 below emitter 52.

Referring again to FIG. 2, the second receiver means within phantom block 60 further comprises a first resistor divider, such as the divider formed by resistors 62 and 64 having a divider output terminal 65. The divider is coupled from the first receiver reference terminal 71 to the interface circuit first reference terminal 22. The second receiver means has a coupler Z2 having a light emitting diode 76 having an anode and a cathode and a switching transistor 74 optically coupled to the light emitting diode. The switching transistor 74 has a conduction channel between its collector and emitter characterized to be conductive in response to current passing through the light emitting diode.

In a first alternative embodiment (not shown), the collector of transistor 74 is connected directly to divider output terminal 65. The switching transistor conduction channel couples the divider output terminal 65, to the second reference potential 22 when the switching transistor is driven into conduction. The coupler circuit is characterized to transfer the conduction channel of the optically coupled switching transistor 74 to a highly conductive state in response to current passing through the light emitting diode exceeding a predetermined level.

Figure 4:
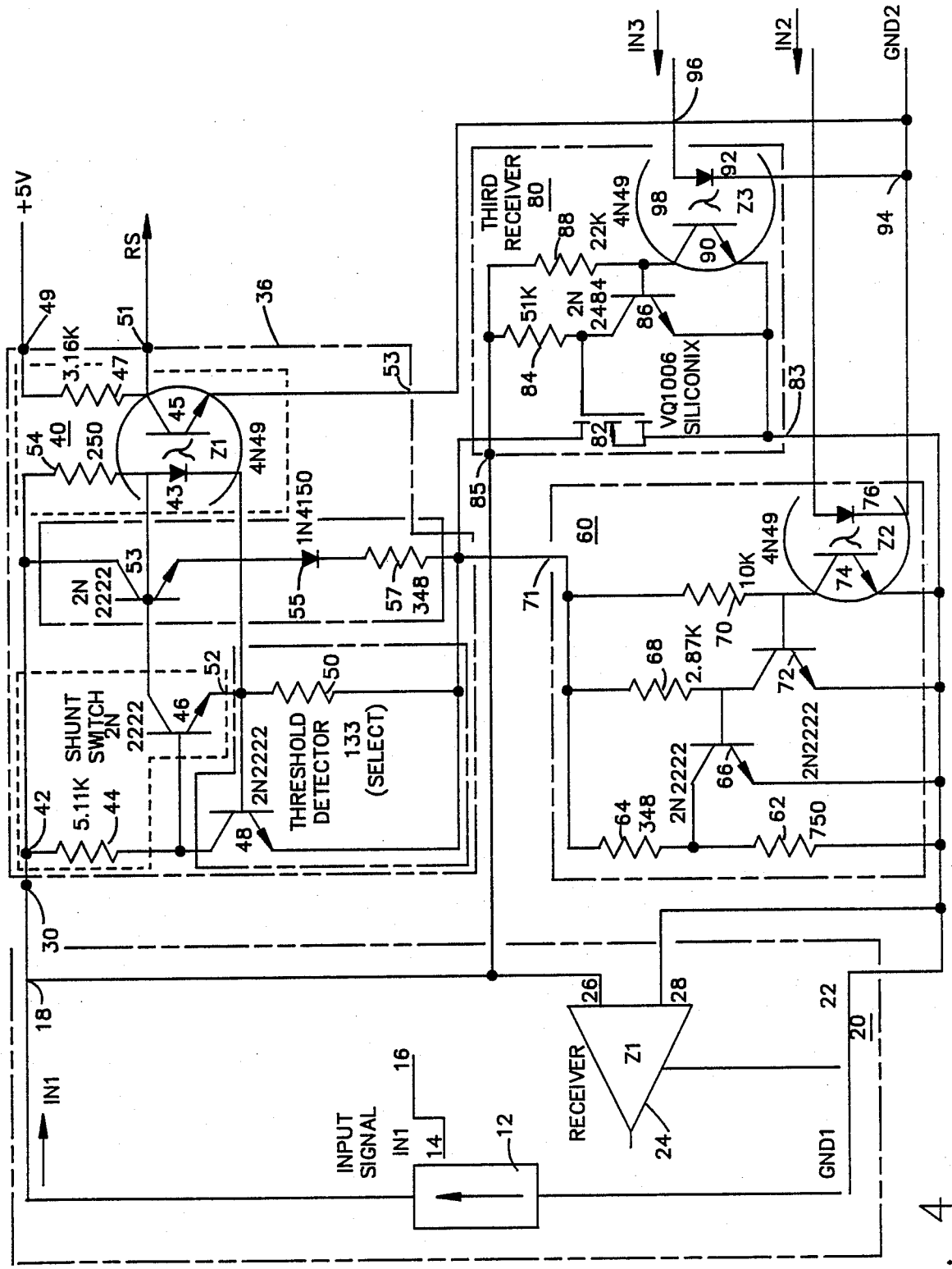
FIG. 4 is a schematic of a two wire interface circuit topology characterized to meet the requirements of the Navy Multiplexed Electrical Distribution and Control Interface Systems requirement.

In the alternative embodiments of FIGS. 2 and 4, resistor 70 in combination with NPN transistor 72, NPN transistor 66 and resistor 68 represent a bias and switching means. Resistors 68 and 70 are common at a terminal connected to the first receiver reference terminal 71. The optical transistor 74 collector terminal is common with the second terminal of resistor 70 and the base of NPN transistor 72. The emitter of NPN transistor 72 and the emitter of NPN transistor 66 are common and are connected to the first reference terminal (GND1) 22. The collector of NPN transistor 72 is common with the second terminal of resistor 68 and with the base of NPN transistor 66. The collector of NPN transistor 66 is connected to the first resistor divider output terminal 65 and switches the first resistor divider output terminal 65 to the first reference terminal in response to the optical coupler transistor 74 being driven into conduction.

FIG. 4 shows a third receiver 80 for switching the first receiver reference terminal 71 directly to the first reference terminal 22 via FET transistor 82. The third receiver 80 also has an optical coupler 98 having an input diode 92 that is responsive to a third input control signal IN3 to terminal 93. Switching transistor 90 is driven into conduction in response to light emitted by light emitting diode 92 in response to current into terminal 93. The third input control current IN3 is returned via the second reference terminal 94, GND2. Switching transistor 86 is biased into conduction by current from resistor 88. Resistor 84 operates as a pull-up resistor for the gate of FET transistor 82. As current is sourced to light emitting diode 92, transistor 90 is driven into conduction turning transistor 86 into a non-conductive state as transistor 86 turns off, the gate of FET transistor 82 is driven high driving FET 82 into a highly conductive state, shorting the first receiver reference terminal 71 to the first reference terminal 22.

The third receiver 80 of FIG. 4 receives bias power for its operation via terminal 85. The third receiver 80 of FIG. 4 receives its bias power for operation via terminal 85. Terminal 85 is coupled to first input terminal 30. The third receiver 80 receives bias power for the support of its operation only when first input terminal 30 receives a high level input signal, i.e. 9.0 mA $\leq$ IN1 $\leq$ 11.0 mA. Operation of the third receiver 80 for the purpose of switching the first receiver reference terminal 71 directly to the first reference terminal 22 via FET transistor 82 is not required in the absence of a high input signal level since first receiver reference terminal 71 is substantially at the potential of the first reference terminal 22 when the input signal IN1 is at a low level, i.e. 0.0 $\leq$ IN1 $\leq$ 3.0 mA.

Figure 6:
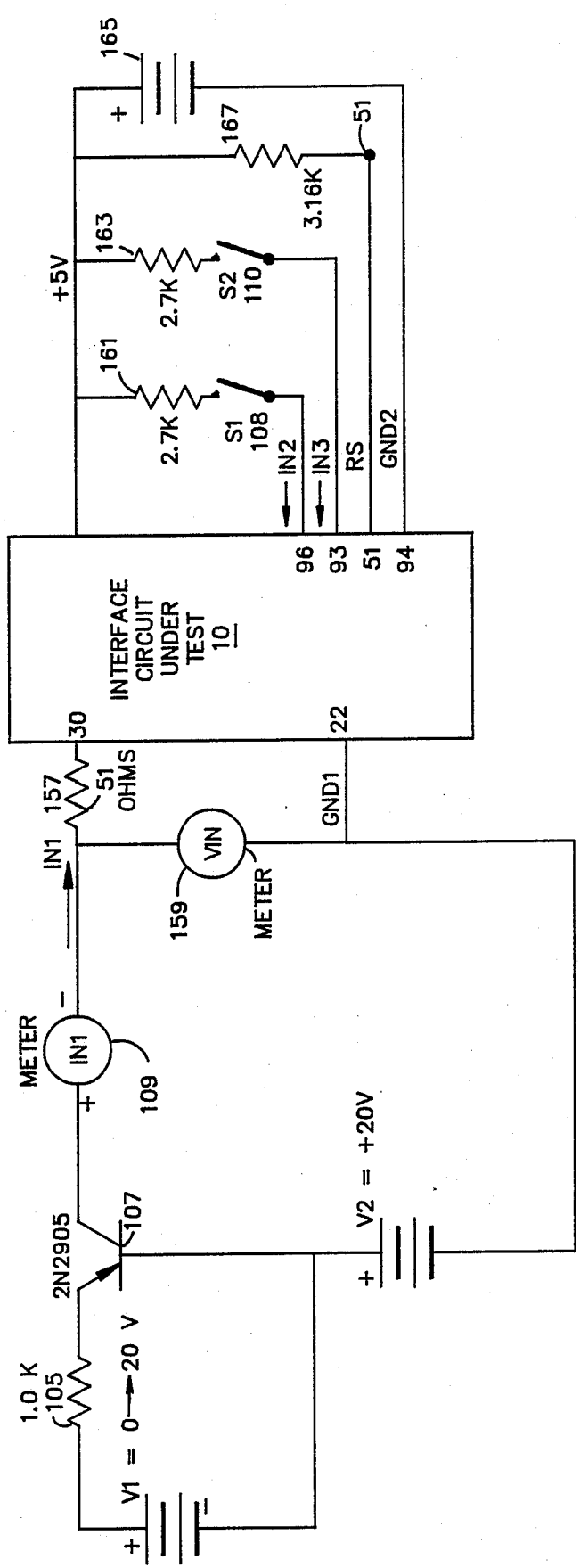
FIG. 6 is a schematic of the test circuit used with the invention interface circuit of FIG. 4 to obtain the test values plotted as solid lines in FIG. 5.

FIG. 6 shows a test circuit for testing the invention interface circuit 10. The V1 source is adjusted and switched on to set the current level of IN1. V2 is typically set to 20 Vdc. Resistor 157 is 51 Ohms. This resistor is necessary to meet the circuit interface requirements for the MEDC specification. Meters 109 and 159 are conventional meters used to monitor the input current and voltage as data is collected or as resistor 50 is adjusted, by selection, for a particular threshold.

Switch S1 is shown in the closed or true position. This position provides current to the second input terminal 96. Referring to FIG. 4, current into second input terminal 96 drives transistor 74 into the conductive or ON state. Transistor 72 is OFF and transistor 66 is ON, providing a highly conductive path around resistor 62. Switch S2 is shown in the open position. No bias current is driven into terminal 93, therefore transistor 90 is OFF, transistor 86 is ON and FET transistor 82 is OFF. First receiver reference terminal 71 is thereby coupled to first reference terminal 22 via resistor 64 with a resistance of 348 Ohms plus the conductive resistance of NPN transistor 66. The switch combination of S1=ON and S2=OFF, therefore describes normal operation.

Figure 5:
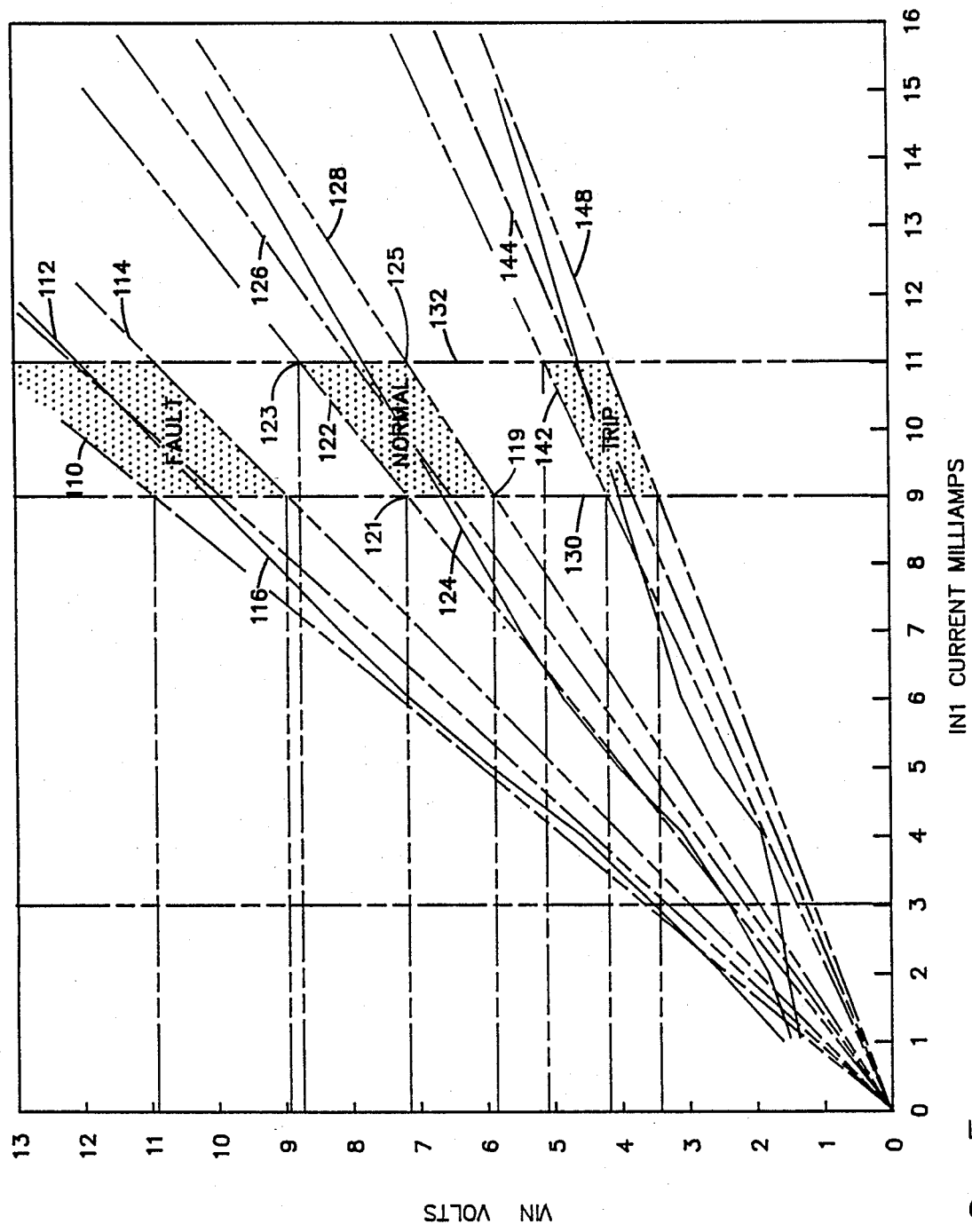
FIG. 5 is a graph showing the voltages (VIN) measured between the first input terminal and the first reference terminal as solid lines for FAULT, NORMAL, and TRIP, for input currents ranging from zero to 16 milliamperes for the circuit of FIG. 4.

Referring to FIG. 5, a dotted hatch region is bounded by reference points 119, 121, 123, and 125. This region shows that an input signal current of 10 milliamperes will provide an input voltage VIN=7.20. Reference line 126 shows the nominal circuit resistance to be approximately 720 Ohms. The nominal operating region for the circuit is bounded by reference lines 122 and 128. Reference line 122 characterizes an input resistance of 720 Ohms plus 10% and reference line 128 characterizes an input resistance of 720 Ohms minus 10%.

Referring again to FIG. 6, as switch S2 is moved to closed position, the state of switch 1 loses relevance. Moving switch S2 to the closed position drives current into terminal 93. FIG. 4 shows that current into terminal 93 will turn FET switch 82 ON thereby coupling first receiver reference terminal 71 to first reference terminal 22 via the channel resistance of the N channel enhancement mode FET switch 82. The ON resistance of a FET switch is typically under 5 Ohms. Larger geometry FET switches have channel resistances under 1 Ohm. The trip condition is characterized with the S2 switch in the ON position. The input voltage to the circuit with a 10 milliampere input signal IN1 to terminal 30 results in an input voltage of 4.2 volts. The trip condition is characterized in FIG. 5 by a region bounded by dashed lines 142, 148 and vertical lines at 9 milliamperes and 11 milliamperes. The nominal input resistance of the circuit when operating in the tripped condition is 420 Ohms. Dashed line 142 represents a resistance of 420 Ohms plus 10% and dashed line 148 represents an input of 420 Ohms minus 10%.

Referring to the test circuit of FIG. 6, the fault condition is characterized by switch 1 and switch 2 both being open. The input voltage to the circuit, VIN, is nominally 11 volts with an input signal current, IN1 equal to 10 milliamperes when switch S1 and switch S2 are open. Referring to FIG. 4, with switch S1 and S2 open, second input signal current IN2 and third input signal current IN3 are zero. FET switch 82 is OFF and NPN switching transistor 66 is OFF. First receiver reference terminal 71 is therefore coupled to first reference terminal 22 via the combined series resistance of resistor 64 and resistor 62. Transistor 72 is ON and resistors 68 and 70 each provide shunt paths in parallel with the series combination of resistors 64 and 62. In addition, NPN switch 86 is ON and resistor 88 provides an additional shunt path in parallel with the series combination of resistors 64 and 62 operating in series with first receiving means 36.

Referring to FIGS. 5 and 6, with S1 and S2 open, the circuit is operating in the fault condition. The fault region is bounded by dash line 110, 114 and vertical current dash lines 130 and 132. The nominal input resistance of the circuit for fault operation is 1100 Ohms. Dash line 110 represents an input resistance of 1100 Ohms plus 10% and dash line 114 represents an input resistance of 1100 Ohms minus 10%.

It can be seen that the output condition of the first signal output terminal 51 with respect to the second reference terminal GND2 94 is high or low as a function of the first input current signal IN1 only. FIG. 5 clearly shows that the input voltage measured between terminals 30 and 22 is a function of the presence or absence of second and third input signal currents IN2 and IN3. The receiver 24 in FIG. 1 is shown monitoring the voltage between input terminals 30 and 22 for the purpose of determining if the circuit is in the normal condition, the tripped condition, or the fault condition when input signal current IN1 is present and in the nominal range of from 9-11 milliamperes.

Table 1 provides the S1 and S2 switch positions for simulating three interface circuit input conditions. The interface circuit input voltage and the input current signal levels for each condition shown in the Table also.

TABLE 1

| SWITCH POSITION | MODE SELECTION | VIN VALUE | IN1 VALUE |
|---|---|---|---|
| S1 · S2' | NORMAL OPERATION | 7.2 V | 10 mA |
| (S1 + S2') | TRIP CONDITION | 4.2 V | 10 mA |
| S1 · S2' | FAULT CONDITION | 11.0 V | 10 mA |

What is claimed is:
1. An interface circuit having
a first reference terminal;
a first input terminal for receiving a first input current signal having a first and second value, each respective value representing a respective logic signal level, referenced to the first reference terminal from a first input current signal source;
at least a second input terminal for receiving a second input current signal referenced to a second reference terminal from a second input current signal source, said second input current signal having a first and second signal current level, said interface circuit comprising:
a first receiver means coupled between said first input terminal and a first receiver reference terminal, said first receiver means having a threshold detector responsive to a predetermined first input current signal threshold level for providing a first output signal (RS) at a first signal output terminal, said first output signal being a logic signal referenced to said second reference terminal;
second receiver means coupled between said first receiver reference terminal and said first reference terminal, said second receiver means being responsive to said second input current signal having a value greater than a first predetermined level for decreasing the value of resistance between said first receiver reference terminal and said first reference terminal to a value less than a first predetermined value and for increasing the value of resistance between said first receiver reference terminal and said first reference terminal to be greater than a second predetermined value in response to said second input current signal being greater than a second predetermined level, the value of input resistance between said first receiver reference terminal and said first reference terminal being substantially independent of said first input current signal first and second signal current levels.

2. The interface circuit of claim 1 wherein said threshold detector further comprises:
a sense resistor coupled between a terminating terminal and said first receiver reference terminal and a switch for coupling a threshold detector output terminal to said first receiver reference terminal in response to said current through said sense resistor exceeding a predetermined limit;
a coupler circuit having a sensing diode having an anode and a cathode and a current limiting resistor coupled from said first input terminal to said current sense diode anode, said sensing diode cathode being coupled to said threshold detector terminating terminal, said coupler circuit also having an output switching means having a conduction channel coupled between said first signal output terminal and said second reference terminal, said coupler circuit being characterized to transfer said conduction channel to a conductive state in response to current passing through said sensing diode from said sense diode anode to cathode and said current exceeding a predetermined level; and,
a shunt switch circuit having a switching transistor having a control terminal and a conduction channel having a collector terminal and an emitter terminal, said output switch collector terminal being coupled to said coupler circuit sensing diode anode and said output switch emitter terminal being coupled to said coupler circuit sensing diode cathode, said switching transistor control terminal being coupled to said interface circuit first input terminal via a resistor, said transistor switch conduction channel being characterized to be conductive in response to a first input current signal second level sourcing current from said interface circuit first input terminal to said switching transistor control terminal, said transistor switch conduction channel being characterized to be substantially non-conductive in response to said first input current signal assuming a first level.

3. The interface circuit of claim 1 wherein said first receiver means further comprises:
a compensation circuit having an input terminal coupled to said interface circuit first input terminal, a control terminal coupled to said coupler circuit sense diode anode and a return terminal coupled to said first receiver reference terminal;

said compensation circuit being characterized to provide a predetermined compensation current to said first receiver reference terminal in response to said shunt switch switching transistor being non-conductive and for interrupting said predetermined compensation current in response to said shunt switch switching transistor being conductive.

4. The interface circuit of claim 1 wherein said second receiver means further comprises:

at least a first resistor divider having a divider output terminal (65) coupled from said first receiver reference terminal to said interface circuit first reference terminal;

an optical coupler having a transistor having collector, base and emitter terminal and a light emitting diode having an anode and a cathode, said light emitting diode cathode being coupled to said second reference terminal (GND2) and said light emitting diode anode being coupled to receive said second input current signal; said optical coupler transistor being characterized to be conductive in response to said current second input current signal exceeding a first predetermined threshold;

optical coupler bias and switching means coupled to said first receiver reference terminal, to said optical coupler transistor collector terminal, to said interface circuit first reference terminal (GND1) and to said first resistor divider output terminal for switching said first resistor divider output terminal to said first reference terminal in response to said optical coupler transistor being driven into conduction.

5. An interface circuit having:

a first reference terminal;

a first input terminal for receiving a first input current signal referenced to said first reference terminal from a first input current signal source;

at least a second input terminal for receiving a second input current signal referenced to a second reference terminal from a second input current signal source, said second input current signal having a first and second signal current level; said interface circuit comprising:

first receiver means coupled between said first input terminal and a first receiver reference terminal (71), said first receiver means being responsive to said first input current signal first and second signal current levels for providing a first output signal at respective first and second levels, said first output signal being referenced to said second reference terminal (GND2) at a first signal output terminal, said first receiver means having:

a first receiver means threshold detector having a sense resistor coupled between a terminating terminal (52) and said first receiver reference terminal (71) and a switch for coupling a threshold detector output terminal (41) to said first receiver reference terminal in response to said current through said sense resistor exceeding a predetermined limit;

a first receiver coupler circuit having a first receiver coupler circuit sensing diode having an anode and a cathode and a current limiting resistor coupled from said first input terminal to said current sense diode anode, said sensing diode cathode being coupled to said threshold detector terminating terminal (52), said coupler circuit also having a first receiver coupler circuit output transistor having a base optically coupled for receiving light from said current sense diode in response to current passing from said current sensing diode anode to said current sense diode cathode, said first receiver coupler circuit output transistor having a conduction channel coupled between said first signal output terminal (51) and said second reference terminal (GND2), said coupler circuit being characterized to transfer said conduction channel to a conductive state in response to current passing through said sensing diode from said sense diode anode to cathode and said current exceeding a predetermined threshold level;

a first receiver shunt switch circuit having a switching transistor having a control terminal and a conduction channel having a collector terminal and an emitter terminal, said switching transistor collector terminal (56) being coupled to said first receiver coupler circuit sensing diode anode an said output switch emitter terminal being coupled to said coupler circuit sensing diode cathode (52), said switching transistor control terminal being coupled to said interface circuit first input terminal via a resistor, said transistor switch conduction channel being characterized to be conductive in response to a first input current signal second level sourcing current from said interface circuit first input terminal to said switching transistor control terminal, said transistor switch conduction channel being characterized to be substantially non-conductive in response to said first input current signal assuming a first level; and a second receiver means coupled between said first receiver reference terminal and said first reference terminal, said second receiver means being responsive to said second input current signal having a value greater than a first predetermined level for decreasing the value of resistance between said first receiver reference terminal and said first reference terminal to a value less than a first predetermined value and for increasing the value of resistance between said first receiver reference terminal and said first reference terminal to be greater than a second predetermined value in response to said second input current signal being greater than a second predetermined level, the value of input resistance between said first receiver reference terminal and said first reference terminal being substantially independent of said first input current signal first and second signal current levels.

* * * * *